United States Patent
Wegberg

(10) Patent No.: US 10,686,464 B2
(45) Date of Patent: Jun. 16, 2020

(54) LATCHED COMPARATOR AND ANALOG-TO-DIGITAL CONVERTER MAKING USE THEREOF

(71) Applicant: STICHTING IMEC Nederland, AE Eindhoven (NL)

(72) Inventor: Roland Van Wegberg, Leuven (BE)

(73) Assignee: STICHTING IMEC NEDERLAND, AE Eindhoven (NL)

( * ) Notice: Subject to any disclaimer, the term of this patent is extended or adjusted under 35 U.S.C. 154(b) by 0 days.

(21) Appl. No.: 16/507,875

(22) Filed: Jul. 10, 2019

(65) Prior Publication Data
US 2020/0021304 A1 Jan. 16, 2020

(30) Foreign Application Priority Data
Jul. 11, 2018 (EP) ..................................... 18182958

(51) Int. Cl.
*H03M 1/46* (2006.01)
*H03F 3/45* (2006.01)
*H03M 1/06* (2006.01)

(52) U.S. Cl.
CPC .......... *H03M 1/46* (2013.01); *H03F 3/45071* (2013.01); *H03M 1/0602* (2013.01); *H03F 2200/331* (2013.01)

(58) Field of Classification Search
CPC .... H03M 1/46; H03M 1/0602; H03M 1/0863; H03M 1/38; H03F 3/45071; H03F 2200/331; G11C 7/065
(Continued)

(56) References Cited

U.S. PATENT DOCUMENTS 9,197,198 B2 * 11/2015 Rajaee ................. H03K 3/0375
9,455,695 B2 * 9/2016 Kull ....................... H03K 5/249

OTHER PUBLICATIONS

Heungjun Jeon et al: "A novel low-power, low-offset, and high-speed CMOS dynamic latched comparator", Analog Integrated Circuits and Signal Processing, Kluwer Academic Publishers, BO, vol. 70, No. 3, Jul. 17, 2011 (Jul. 17, 2011), pp. 337-346, XP035013406, ISSN: 1573-1979, DOI: 10.1007/S10470-011-9687-5.
(Continued)

*Primary Examiner* — Khai M Nguyen
(74) *Attorney, Agent, or Firm* — Moser Taboada

(57) ABSTRACT

A latched comparator comprises a pre-amplifier stage with a positive input ($V_{in,p}$), a negative input ($V_{in,n}$); and a differential output ($\Delta V_{out}$) comprising a first output ($V_{out,1}$) and a second output ($V_{out,2}$), the pre-amplifier stage comprising a first cascode pair, comprising a first amplifying transistor (MN2) and a first cascode transistor (MN4) connected at a first cascode node, the first amplifying transistor (MN2) being controlled by the positive input ($V_{in,p}$) and the first cascode transistor (MN4) being connected, opposite to the first cascode node, to the first output ($V_{out,1}$); a second cascode pair, comprising a second amplifying transistor (MN3) and a second cascode transistor (MN5) connected at a second cascode node, the second amplifying transistor (MN3) being controlled by the negative input ($V_{in,n}$) and the second cascode transistor (MN5) being connected, opposite to the second cascode node, to the second output ($V_{out,2}$); a first gain-boosting transistor (MN6) connected between the first output ($V_{out,1}$) and the first cascode node; and a second gain-boosting transistor (MN7) connected between the second output ($V_{out,2}$) and the second cascode node, wherein the first gain-boosting transistor (MN6) and the second gain-boosting transistor (MN7) are cross-coupled, so that the first gain-boosting transistor (MN6) is controlled by the
(Continued)

second output ($V_{out,2}$) and the second gain-boosting transistor (MN7) is controlled by the first output ($V_{out,2}$).

12 Claims, 4 Drawing Sheets

(58) Field of Classification Search
USPC ....... 341/155, 158, 163, 165; 327/55, 57, 65
See application file for complete search history.

(56) References Cited

OTHER PUBLICATIONS

Santosh Prabhu Astgimath: "A low noise, low power dynamic amplifier with common mode detect and a low power, low noise comparator for pipelined SAR-ADC by Santosh Prabhu Astgimath", Aug. 30, 2012 (Aug. 30, 2012), pp. 1-110, XP055542121, Delft University of Technology Retrieved from the Internet: URL:https://repository.tudelft.nl/islandora/object/uuid:92f240dd-67ec-4f61-9210-4763d7b8a90a/datastream/OBJ/download.

Mingle Zhang et al: "An energy-efficient SAR ADC using a single-phase clocked dynamic comparator with energy and speed enhanced technique", IEEE Electronics Express, vol. 14, No. 8, Apr. 1, 2017 (Apr. 1, 2017), pp. 1-9, XP055541589, DOI: 10.1587/elex.14.20170219.

Molaei Hasan et al: "A low-power comparator-reduced flash ADC using dynamic comparators", 2017 24th IEEE International Conference on Electronics, Circuits and Systems (ICECS), IEEE, Dec. 5, 2017 (Dec. 5, 2017), pp. 5-8, XP033320650, DOI: 10.1109/ICECS.2017.8292010.

Athanasios Ramkaj et al: "A 36.4dB SNDR @ 5GHz 1.25GS/s 7b 3.56mW Single-Channel SAR ADC in 28nm Bulk CMOS", IEEE ESS 2017.

Extended European Search Report in EP18182958.1, dated Feb. 4, 2018.

Wang Hui et al: "A Battery-Powered Wireless Ion Sensing System Consuming 5.5 nW of Average Power", IEEE Journal of Solid-State Circuits, IEEE Service Center, Piscataway, NJ, USA, vol. 53, No. 7, Jul. 1, 2018 (Jul. 1, 2018), pp. 2043-2053, XP011685899, ISSN: 0018-9200, DOI: 10.1109/JSSC.2018.2815657.

* cited by examiner

LATCHED COMPARATOR AND ANALOG-TO-DIGITAL CONVERTER MAKING USE THEREOF

CROSS REFERENCE TO RELATED APPLICATIONS

This application claims priority to EPC Application No. 18182958.1 filed on Jul. 11, 2018, which is incorporated herein by reference in its entirety.

TECHNICAL FIELD

The present inventive concept relates to a latched comparator, for example for use in an analog to digital converter (ADC).

BACKGROUND

A comparator compares two inputs and takes a binary decision. Latched comparators are driven by a clock signal, allowing for resetting the circuitry ahead of each comparison.

Latched comparators employing a dynamic pre-amplifier stage are known for their low power consumption, since their dominant sub-threshold operation and no DC bias current makes the power consumption only proportional to the operating frequency. Further, the pre-amplifier stage reduces kick-back noise of a subsequent latch.

A typical application of latched comparators is analog-to-digital converters (ADCs), such as successive approximation register ADCs (SAR ADCs) or sigma-delta modulation ADCs (SDM ADCs).

An important property of the comparator of a high resolution SAR ADC is the input referred noise, which is directly related to the signal-to-noise ratio (SNR) performance of the ADC. The comparator has a range where noise influences the decision no matter the sign of the difference of the input signal. This noise range needs to become smaller when the resolution of the ADC increases. Thus, for low-power, high-resolution ADCs, a low-power low-noise comparator is required.

A latched comparator according to the prior art is described in M. van Elzakker, E. van Tuijl, P. Geraedts, D. Schinkel, E. Klumperink, and B. Nauta, "A 10-bit charge-redistribution ADC consuming 1.9 W at 1 MS/s," IEEE Journal of Solid-State Circuits, vol. 45, no. 5, 2010.

SUMMARY

An objective of the present inventive concept is to provide a low-power, low-noise latched comparator.

To this end, according to a first aspect of the present inventive concept there is provided a latched comparator comprising a pre-amplifier stage with a positive input, a negative input; and a differential output comprising a first output and a second output, the pre-amplifier stage comprising a first cascode pair, comprising a first amplifying transistor and a first cascode transistor connected at a first cascode node, the first amplifying transistor being controlled by the positive input and the first cascode transistor being connected, opposite to the first cascode node, to the first output; a second cascode pair, comprising a second amplifying transistor and a second cascode transistor connected at a second cascode node, the second amplifying transistor being controlled by the negative input and the second cascode transistor being connected, opposite to the second cascode node, to the second output, a first gain-boosting transistor connected between the first output and the first cascode node; and a second gain-boosting transistor connected between the second output and the second cascode node, wherein the first gain-boosting transistor and the second gain-boosting transistor are cross-coupled, so that the first gain-boosting transistor is controlled by the second output and the second gain-boosting transistor is controlled by the first output.

The term pre-amplifier, pre-amplifier stage, and similar, are to be understood as relating to an amplifying stage which is followed by further circuitry of any kind. In particular, it shall not be read as being limited to denote an amplifying stage which is followed by further amplification.

The cascode pairs and the gain-boosting transistors in the pre-amplifier stage have the effect of increasing the pre-amplifier gain and making the gain substantially time-invariant. This allows the decision point of a subsequent latch to be chosen more freely in an optimal pre-amplifier voltage range where the input referred noise of the input transistors is low. The higher gain also reduces the contribution to the input referred noise of the sampling capacitors and the noise of the latch at the decision point. Thus, a comparator with low noise, suitable for a high-resolution ADC, is provided which still operates at low power. Further, this is provided in a circuit with a relatively simple topology, that can be implemented in a small integrated circuit (IC) area.

According to one embodiment, the latched comparator is controlled by a clock signal and/or supplied by a supply voltage. The dock signal may be used to reset the latched comparator, so that each comparison is started from a well-defined state, avoiding hysteresis. The supply voltage may be used to power the latched comparator.

According to one embodiment, the first cascode transistor and the second cascode transistor each are controlled by a common-mode voltage. Compared to using the supply voltage, this has an advantage of a better-controlled and slightly larger output range of the pre-amplifier stage.

According to one embodiment, the first cascode transistor and the second cascode transistor are each controlled by the supply voltage. Compared to using a common-mode voltage, this has an advantage of requiring less power, as using the common-mode voltage requires buffering of a mid-supply voltage.

According to one embodiment the first amplifying transistor, the second amplifying transistor, the first cascode transistor, and the second cascode transistor are NMOS transistors. The use of MOS transistors allows for a low-current, low-power device.

According to one embodiment, the latched comparator further comprises a block pulling the first output and the second output towards the supply voltage absent the clock signal, the block preferably comprising a first, preferably PMOS, transistor and a second, preferably PMOS, transistor, each controlled by the clock signal and connected between the supply voltage and, respectively, the first output and the second output. Thus, between comparisons, absent the clock signal, the first output and the second output are reset to a high state near the supply voltage, which will be the state at the start of the next comparison upon the next raising of the clock signal. This ensures that each comparison is started from a well-defined state, avoiding hysteresis.

According to one embodiment the latched comparator further comprises a block pulling the first amplifying transistor opposite to the first cascode node and the second amplifying transistor opposite to the second cascode node towards ground when the clock signal is present, the block preferably comprising an NMOS connected between ground and the lower transistor of the first cascode pair and the lower transistor of the second cascode pair, the NMOS transistor being controlled by the clock signal.

According to one embodiment, the latched comparator further comprises a block pulling the first cascode node and the second cascode node towards the supply voltage absent the clock signal, the block preferably comprising a first, preferably PMOS, transistor and a second, preferably PMOS, transistor, each connected between the supply voltage and, respectively, the first cascode node and the second cascode node and controlled by the clock signal. This further contributes to reducing hysteresis by starting each comparison with the circuit in a well-defined state.

According to one embodiment, the latched comparator further comprises a latch stage, which is configured to receive the differential output from the pre-amplifier stage. Together, the pre-amplifier stage and the latch stage provide a complete latched comparator with the advantages described above.

For all embodiments described comprising PMOS and NMOS transistors, embodiments where all thus described PMOS transistors are replaced with NMOS transistors, and all NMOS transistors are replaced with PMOS transistors, are equally possible.

According to a second aspect of the present inventive concept, there is provided an analog-to-digital converter, comprising the latched comparator according to the first aspect, wherein the analog-to-digital converter is configured to provide an analog signal to be converted and a reference signal on, respectively, the positive input and the negative input of the latched comparator.

Effects and features of this second aspect are largely analogous to those described in connection with the first aspect Embodiments mentioned in relation to the first aspect are largely compatible with the second aspect.

This implies that an analog-to-digital converter having low noise in the comparator is provided, which enables an analog-to-digital converter having a high resolution.

According to one embodiment, the analog-to-digital converter is a successive approximation register analog-to-digital converter.

This aspect may generally present the same or corresponding advantages as the former aspect.

According to a third aspect, there is provided a biomedical sensor device comprising the latched comparator according to the first aspect or an analog-to-digital converter according to the second aspect.

Effects and features of this third aspect are largely analogous to those described above in connection with the first and second aspects. Embodiments mentioned in relation to the first and second aspects are largely compatible with the third aspect.

The latched comparator and/or the analog-to-digital converter may advantageously be used in a biomedical sensor device for measurement circuitry which may be used in the biomedical sensor device. Thus, such measurement circuitry may be provided with a low-noise comparator, which enables an analog-to-digital converter having a high resolution.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
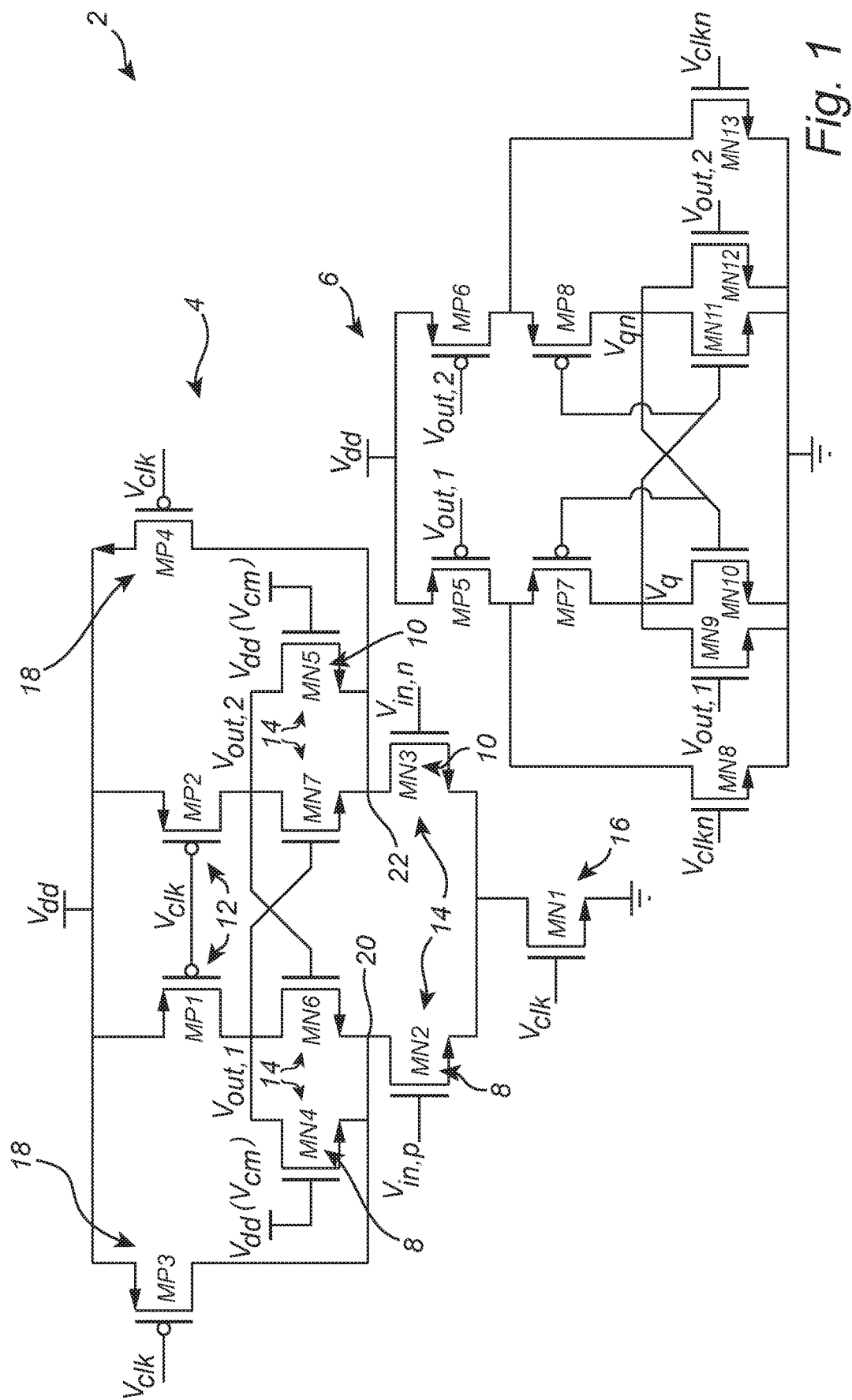
FIG. 1 is a schematic showing a latched comparator according to the present inventive concept, where the cascode transistors are controlled by the supply voltage.

FIG. 1 shows a schematic of a latched comparator 2 according to the present inventive concept.

The latched comparator comprises a pre-amplifier stage 4. The pre-amplifier stage 4 has a positive input $V_{in,p}$ and a negative input $V_{in,n}$, suitable for, when used in an ADC, respectively, an analog voltage that is to be digitized and a reference voltage to which, as part of the digitization procedure, the analog voltage is to be compared. Further, the pre-amplifier stage 4 has differential output comprising a first output $V_{out,1}$ and a second output $V_{out,2}$.

The circuitry of the latched comparator 2 may be powered by a supply voltage $V_{dd}$ and controlled by a clock signal $V_{clk}$. The clock signal $V_{clk}$ then controls the pacing of comparison, having a leading edge of a positive pulse at the start of each comparison and being at ground potential between comparisons.

The latched comparator 4 comprises an amplifying block 14 comprising a first 8 and a second cascode pair 10 and a first gain-boosting transistor MN6 and a second gain-boosting transistor MN7. The first cascode pair 8 comprises a first amplifying transistor MN2 and a first cascode transistor MN4. The second cascode pair 10 comprises a second amplifying transistor MN3 and a second cascode transistor MN5. In the depicted embodiment, MN2, MN3, MN4, MN5, MN6, and MN7 are NMOS transistors.

The gate terminals of the cascode transistors MN4 and MN5 may be connected to the supply voltage $V_{dd}$. Alternatively, they may be connected to a common-mode voltage $V_{cm}$, which may be generated in a conventional way by buffering a mid-supply. The supply voltage $V_{dd}$ or the common-mode voltage $V_{cm}$ thus controls transistors MN4 and MN5.

In either case, during operation of the pre-amplifier stage, the cascode transistors MN4 and MN5 will be in a saturated permanently conducting stage between source and drain. The drain terminals of MN4 and MN5 are connected to, respectively, the first output $V_{out,1}$ and the second output $V_{out,2}$, while the opposite source terminals are connected to, respectively, a first cascode node 20 and a second cascode node 22.

The gate terminals of the amplifying transistors MN2 and MN3 are connected, respectively, to the positive input $V_{in,p}$ and the negative input $V_{in,n}$, those inputs thereby controlling the respective transistors, while the drain terminals are connected to, respectively the first cascode node 20 and the second cascode node 22. Typically, to provide a high gain, the amplifying transistors MN2 and MN3 work in weak-inversion.

The first gain-boosting transistor MN6 is connected at its drain terminal to the first output $V_{out,1}$ and at its source terminal to the first cascode node 20. Thus, it is connected in parallel to the cascode transistor MN4.

Similarly, the second gain-boosting transistor MN7 is connected at its drain terminal to the second output $V_{out,2}$ and at its source terminal to the second cascode node 20. Thus, it is connected in parallel to the cascode transistor MN5.

The first gain-boosting transistor MN6 and the second gain-boosting transistor MN7 are cross-coupled in the sense that the first output $V_{out,1}$ is connected to the gate terminal of the second gain-boosting transistor MN7, while the second output $V_{out,2}$ is connected to the gate terminal of the first gain-boosting transistor $V_{out,1}$. Thus, the first output $V_{out,1}$ controls the second gain-boosting transistor, while the second output $V_{out,2}$ controls the first gain-boosting transistor. This positive feedback structure provides a gain boost for the pre-amplifier stage 4. However, it is not used as a latch. To achieve a high gain of the pre-amplifier stage, the transconductance of transistors MN6 and MN7 needs to be small (see below). Therefore, the positive feedback structure does not have enough loop gain to work as a latch.

Further, the latched comparator 4 may comprise a block 12 comprising PMOS transistors MP1 and MP2, to the respective gate terminals of which the clock signal $V_{clk}$ is connected, the clock signal $V_{clk}$ thus controlling transistors MP1 and MP2. Further, to the drain terminals of each of MP1 and MP2, the supply voltage $V_{dd}$ is connected. The source terminals of MP1 and MP2 are connected, respectively, to the outputs $V_{out,1}$ and $V_{out,2}$. When the clock signal $V_{clk}$ is in a low state, i.e., absent, the transistors MP1 and MP2 will become conductive between drain and source in a saturated state, pulling the respective output voltages $V_{out,1}$ and $V_{out,2}$ towards the supply voltage $V_{dd}$, pre-charging them ahead of the next comparison. This pulling will cease as the clock signal $V_{clk}$ goes to a high state at the start of a comparison, as the transistors MP1 and MP2 will cease to be conductive between drain and source, but ensures that each comparison starts at a well-defined state with respect to $V_{out,1}$ and $V_{out,2}$, avoiding hysteresis.

Further, the pre-amplifier stage 4 may comprise a block 16 comprising a single NMOS transistor MN1, wherein a source terminal of the transistor MN1 is connected to ground, a drain terminal of the transistor MN1 is connected to each of the drain terminals of cascode transistors MN2 and MN3, and a gate terminal of the transistor MN1 is connected to the clock signal $V_{clk}$. When the clock signal goes high at the start of a comparison, MN1 will become conductive between source and drain, thus pulling the drain terminals, i.e., the terminals opposite the cascode nodes 20 and 22, of the cascode transistors MN2 and MN3 towards ground.

Further, the pre-amplifier stage 4 may comprise a block 18 comprising two PMOS transistors MP3 and MP4, to the respective gate terminals of which the clock signal $V_{clk}$ is connected. Further, the supply voltage $V_{dd}$ is connected to the drain terminals of each and MP3 and MP4. To the source terminals of MP3 and MP4 are connected, respectively, the cascode nodes 20, 22 of the first cascode pair 8 and the second cascode pair 10. When the clock signal $V_{clk}$ is absent, i.e., in a low state, the transistors MP3 and MP4 will become conductive between drain and source, pulling the respective cascode node towards the supply voltage $V_{dd}$. This pulling will cease as the clock signal $V_{clk}$ goes to a high state at the start of a comparison, as the transistors MP3 and MP4 will cease to be conductive between drain and source. This further contributes to reducing hysteresis by starting each comparison with the cascode nodes 20 and 22 at well-defined potentials.

Further, the latched comparator 2 may comprise a latch stage 6, forming a complete latched comparator 2. FIG. 1 gives one example of such a latch stage, but other options are equally possible. In the depicted embodiment, the differential outputs $V_{out,1}$ and $V_{out,2}$ of the pre-amplifier stage 6 are connected, respectively, to the gate terminals of PMOS transistors MP5 and MP6, whose respective source terminals are connected to the supply voltage $V_{dd}$. Thus, the latch stage 6 is configured to receive the differential output from the pre-amplifier stage 4. Further, the differential outputs $V_{out,1}$ and $V_{out,2}$ of the pre-amplifier stage 6 are connected, respectively, to the gate terminals of NMOS transistors MN9 and MN12, the source terminals of which are connected to ground and the drain terminals of which are connected, respectively, to the first and second latch outputs $V_q$ and $V_{qn}$. Latching is performed by latch transistors MP7 and MP8 (PMOS) and MN10 and MN11 (NMOS), wherein the first latch output $V_q$ is connected to the gate terminals of transistors MP8 and MN11 and to the drain terminals of transistors MP7 and MN10, while the second latch output $V_{qn}$ is connected to the gate terminals of transistors MP7 and MN10 and to the drain terminals of transistors MP8 and MN11. The source terminals of transistors MN9, MN10, MN11, and MN12 are connected to ground, while the source terminals of transistors MP7 and MP8 are connected to the drain terminals of, respectively, transistors MP5 and MP6. Further, NMOS transistors MN8 and MN13 are connected at their respective gate terminals to a signal $V_{clkn}$ which is a logical negation of the clock signal $V_{clk}$, at their respective source terminals to ground and at their respective drain terminals to, respectively, the drain terminal of transistor MP5 and the source terminal of transistor MP7, and the drain terminal of transistor MP6 and the source terminal of transistor MP8.

The latched comparator of FIG. 1 may form part of an analog-to-digital converter (ADC), specifically a successive-approximation analog-to-digital converter (SAR ADC) or a delta-sigma modulation analog-to-digital converter (DSM ADC). Typically, the analog voltage to be converted will then be provided on the positive input $V_{in,p}$ while a reference signal, with which the analog voltage is to be compared, is provided on the negative input $V_{in,n}$. For instance, the ADC may be used in a biomedical sensor device having measurement circuitry which may utilize the ADC comprising the latched comparator.

Figure 2:
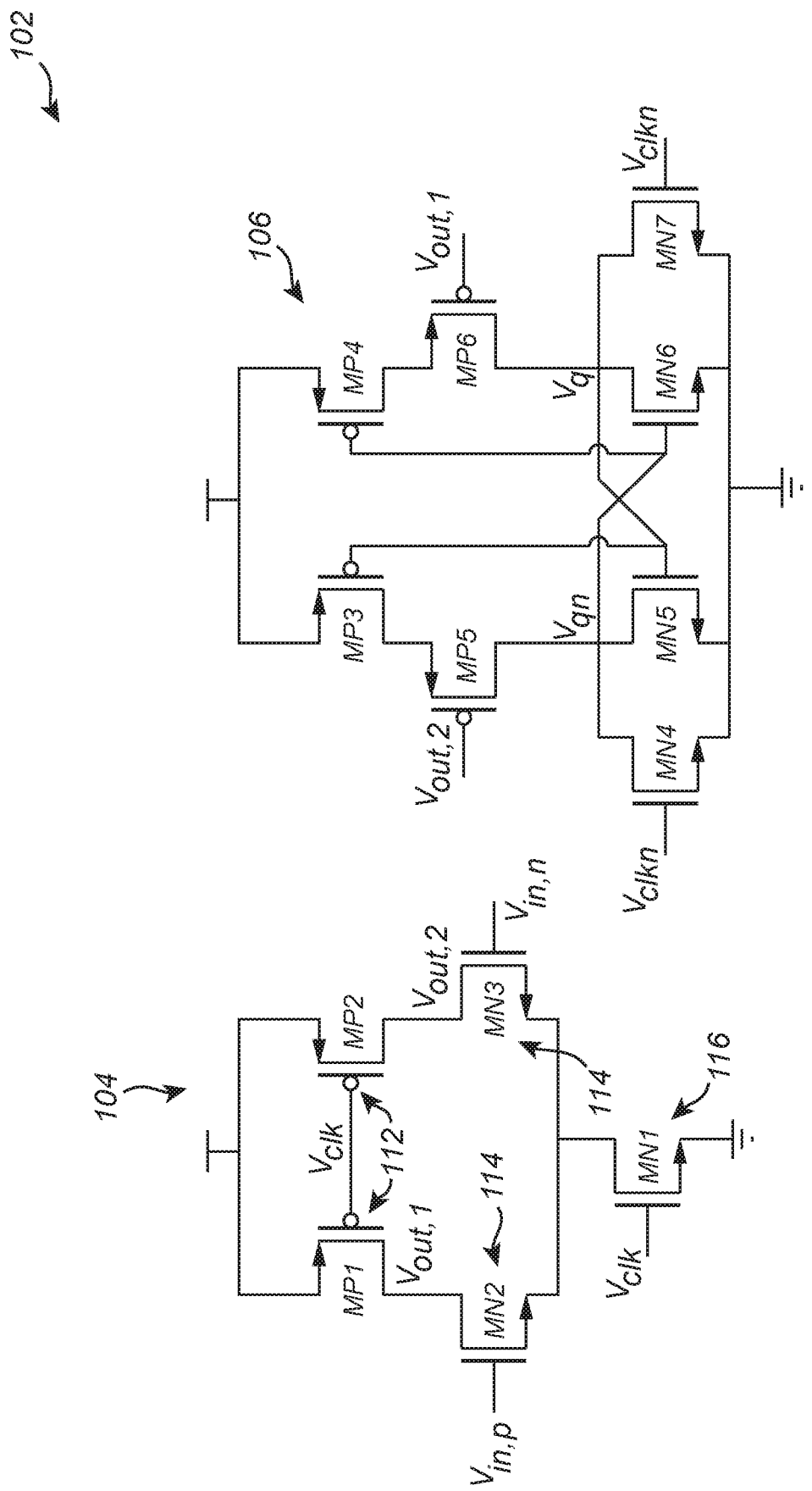
FIG. 2 is a schematic showing a latched comparator not according to the present inventive concept, as a comparison.

As a comparison, FIG. 2 shows a latched comparator 102 not according to the present inventive concept, comprising a pre-amplifier stage 104 and a latch stage 106. The latched comparator 104 comprises a block 112 comprising PMOS transistors MP1 and MP2 functioning similar to the block 12 as described above in conjunction with FIG. 1. Further, the pre-amplifier stage comprises a block 116 comprising a single NMOS transistor MN1 functioning similar to the block 16 as described above in conjunction with FIG. 1. However, instead of a two cascode pairs and two gain-boosting transistors, in the amplifying block 114 there are only two single amplifying NMOS transistors MN2 and MN3. MN2 is at its gate terminal connected to the positive input $V_{in,p}$, at its drain terminal connected to the drain terminal of MP1 and to the first output Vout,1 and at its source terminal connected to the drain terminal of transistor MN1. MN3 is at its gate terminal connected to the negative input $V_{in,n}$, at its drain terminal connected to the drain terminal of MP2 and to the second output $V_{out,2}$ and at its source terminal connected to the drain terminal of transistor MN1. Further, the latched comparator 102 comprises a latching stage 106 as depicted in FIG. 2.

The gain A of the pre-amplifier stage 104 in FIG. 2 can be constructed, under the assumption that the transconductance of transistor MN2 $g_{m,MN2}$ is constant, as:

$$\Delta V_{out} = V_{out,2} - V_{out,1} = \frac{-g_{m,MN2} * R_{out}}{\frac{1}{2} * C * R_{out}} * (V_{in,p} - V_{in,n}) \approx \frac{-g_{m,MN2} * t}{\frac{1}{2} * C} * \Delta V_{in}$$

$$A = \frac{\Delta V_{out}}{\Delta V_{in}} = \frac{-g_{m,MN2} * t}{\frac{1}{2} * C}$$

wherein C is the output capacitance and $R_{out}$ is the output impedance. The (absolute value of) gain A can be seen to be increasing over time. Thus, A is time-varying.

In contrast, the gain A of the latched comparator of FIG. 1 according to the present inventive concept can be constructed as:

$$\Delta V_{out} = V_{out,2} - V_{out,1} = \frac{-g_{m,MN2} * \frac{t}{\frac{1}{2} * C}}{g_{m,MN6} * \frac{t}{\frac{1}{2} * C} + 1} * (V_{in,p} - V_{in,n}) \approx \frac{-g_{m,MN2}}{g_{m,MN6}} * \Delta V_{in}$$

$$A = \frac{\Delta V_{out}}{\Delta V_{in}} = \frac{-g_{m,MN2}}{g_{m,MN6}}$$

wherein $g_{m,MN6}$ is the transconductance of transistor MN6. As can be seen, the time-dependence of the gain A is to a large degree canceled out. Further, it can be seen that for a large gain A, $g_{m,MN6}$ should be small.

Figure 4:
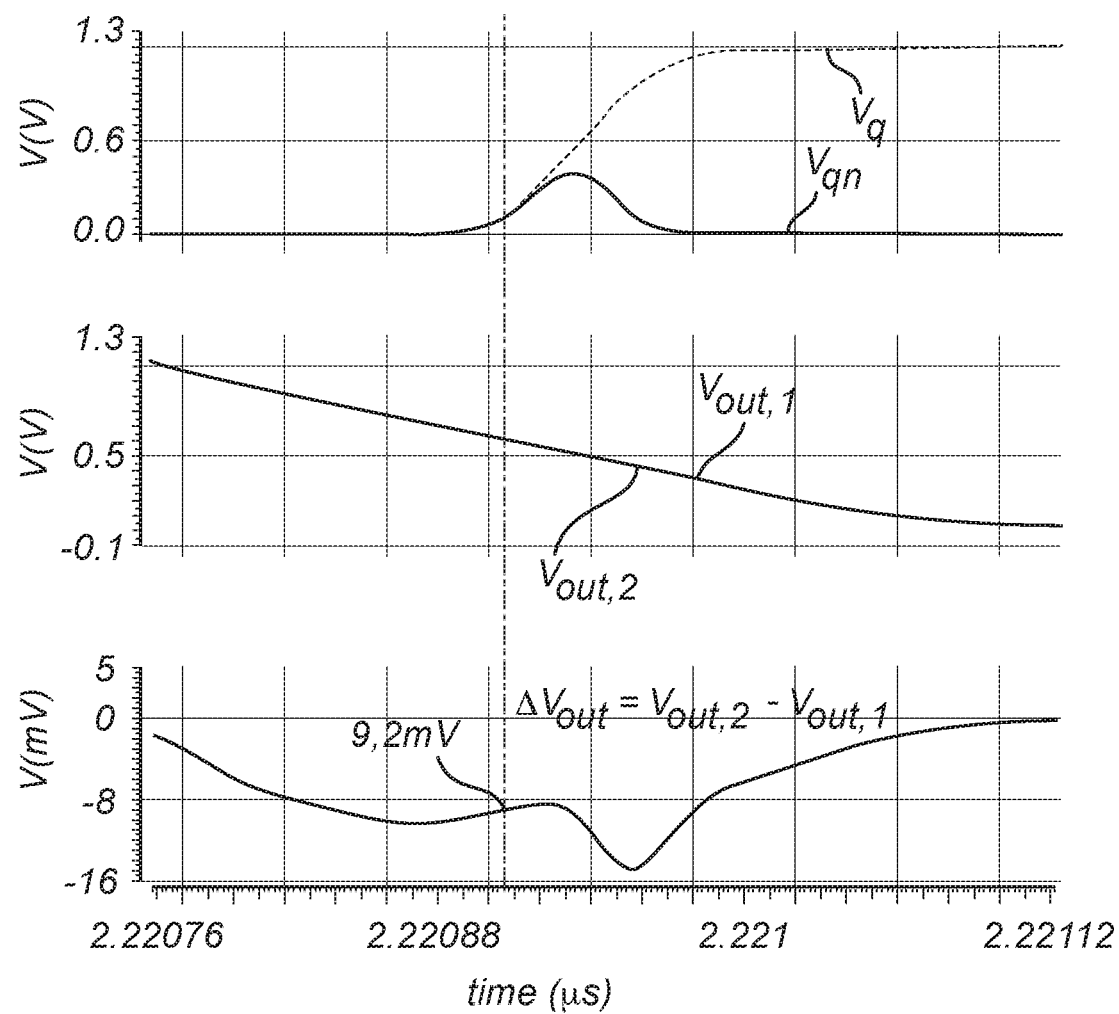
FIG. 4 shows simulated transient behavior of the latched comparator of FIG. 1.

FIG. 4 shows a simulated time-domain transient behavior of the latched comparator 2 of FIG. 1. The upper graph shows the latch outputs $V_q$ and $V_{qn}$, the middle graph shows the pre-amplifier stage 4 outputs $V_{out,1}$ and $V_{out,2}$, and the lower graph shows the difference of $V_{out,1}$ and $V_{out,2}$, i.e., the differential output of the pre-amplifier stage 4. The latch decision point is marked by a vertical line. The input voltage difference is 200 μV and the output is 9.2 mV, giving a pre-amplifier stage 4 gain of 46 at the decision point. The differential output has a plateau around the decision point, indicating constant gain, giving opportunity for control of the decision point of the latch.

Figure 3:
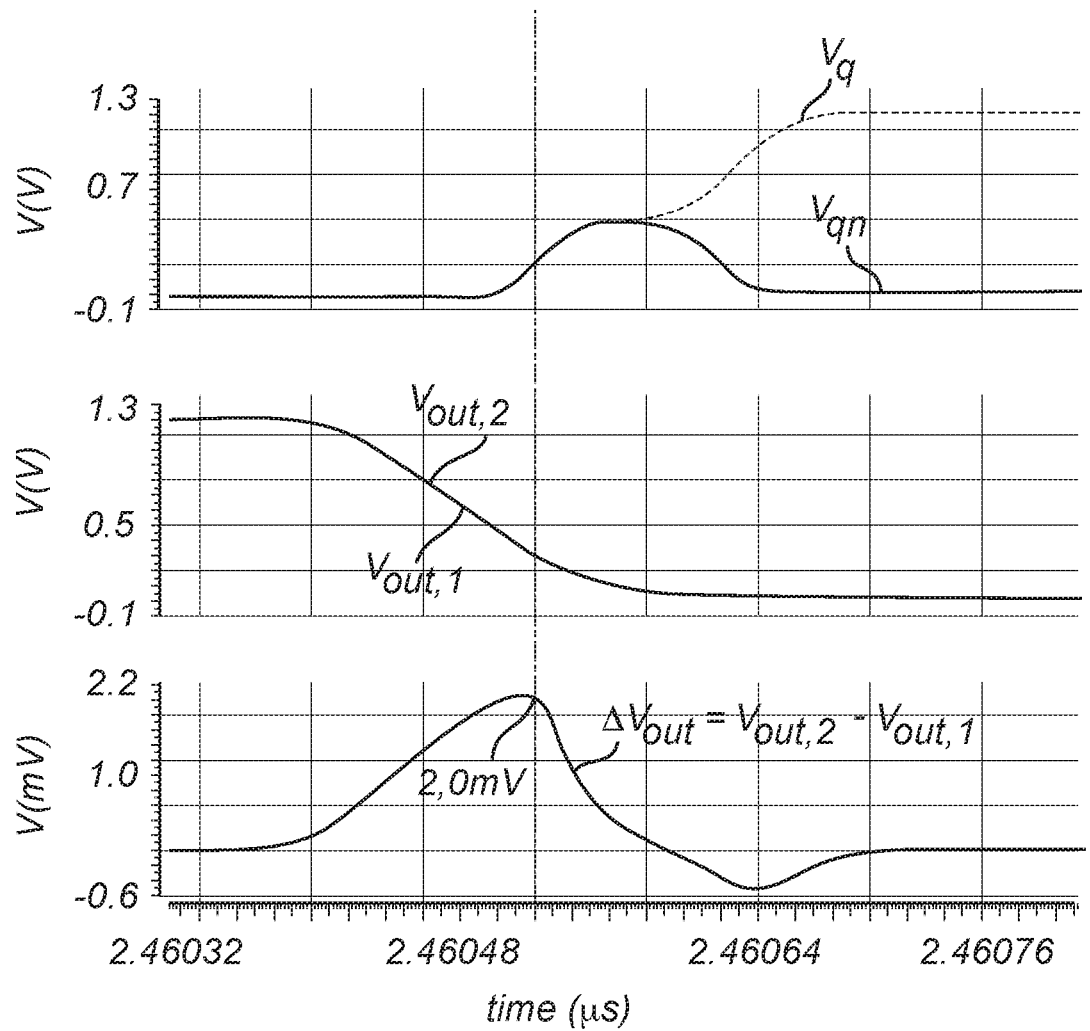
FIG. 3 shows simulated transient behavior of the latched comparator of FIG. 2.

As a comparison, FIG. 3 shows the time-domain transient behavior of the latched comparator 102 of FIG. 2. As in FIG. 4, the upper graph shows the latch outputs $V_q$ and $V_{qn}$, the middle graph shows the pre-amplifier stage 104 outputs $V_{out,1}$ and $V_{out,2}$, and the lower graph shows the difference of $V_{out,1}$ and $V_{out,2}$, i.e., the differential output of the pre-amplifier stage 104. The latch decision point is marked by a vertical line. The gain is clearly time-varying. The input voltage difference is 200 μV and the output is 2.0 mV, giving a pre-amplifier stage 104 gain A of 10 at the decision point.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A latched comparator comprising a pre-amplifier stage with:
   a positive input,
   a negative input; and
   a differential output comprising a first output and a second output,
   said pre-amplifier stage comprising:
   a first cascode pair, comprising a first amplifying transistor and a first cascode transistor connected at a first cascode node, said first amplifying transistor being controlled by said positive input and said first cascode transistor being connected, opposite to said first cascode node, to said first output;
   a second cascode pair, comprising a second amplifying transistor and a second cascode transistor connected at a second cascode node, said second amplifying transistor being controlled by said negative input and said second cascode transistor being connected, opposite to said second cascode node, to said second output;
   a first gain-boosting transistor connected between said first output and said first cascode node; and
   a second gain-boosting transistor connected between said second output and said second cascode node,
   wherein said first gain-boosting transistor and said second gain-boosting transistor are cross-coupled, so that said first gain-boosting transistor is controlled by said second output and said second gain-boosting transistor is controlled by said first output.

2. The latched comparator of claim 1, controlled by a clock signal and supplied by a supply voltage.

3. The latched comparator of claim 1 wherein said first cascode transistor and said second cascode transistor each are controlled by a common-mode voltage.

4. The latched comparator of claim 2, wherein said first cascode transistor and said second cascode transistor each are controlled by said supply voltage.

5. The latched comparator of claim 1, wherein said first amplifying transistor, said second amplifying transistor, said first cascode transistor, and said second cascode transistor are NMOS transistors.

6. The latched comparator of claim 2, further comprising a block pulling said first output and said second output towards said supply voltage absent said clock signal, said block preferably comprising a first, preferably PMOS, transistor and a second, preferably PMOS, transistor, each controlled by said clock signal and connected between said supply voltage and, respectively, said first output and said second output.

7. The latched comparator of claim 2, further comprising a block pulling said first amplifying transistor opposite to said first cascode node and said second amplifying transistor opposite to said second cascode node towards ground when said clock signal is present, said block preferably comprising an NMOS transistor connected between ground and said first amplifying transistor and said second amplifying transistor, said NMOS transistor being controlled by said clock signal.

8. The latched comparator of claim 2, further comprising a block pulling said first cascode node and said second cascode node towards said supply voltage absent said clock signal, said block preferably comprising a first, preferably PMOS, transistor and a second, preferably PMOS, transistor, each connected between said supply voltage and, respectively, said first cascode node and said second cascode node and controlled by said clock signal.

9. The latched comparator of claim 1, further comprising a latch stage, configured to receive the differential output from the pre-amplifier stage.

10. An analog-to-digital converter, comprising: the latched comparator of claim 1, wherein the analog-to-digital converter is configured to provide an analog signal to be converted and a reference signal on, respectively, the positive input and the negative input of the latched comparator.

11. The analog-to-digital converter of claim 10, wherein the analog-to-digital converter is a successive approximation register analog-to-digital converter.

12. A biomedical sensor device comprising the analog-to-digital converter of claim 10.

* * * * *